United States Patent
Kezuka et al.

(10) Patent No.: US 10,813,209 B2
(45) Date of Patent: Oct. 20, 2020

(54) MULTILAYER SUBSTRATE, ELECTRONIC DEVICE, AND A METHOD FOR MANUFACTURING A MULTILAYER SUBSTRATE

(71) Applicant: Murata Manufacturing Co., Ltd., Nagaokakyo-shi, Kyoto-fu (JP)

(72) Inventors: Shuichi Kezuka, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/011,708

(22) Filed: Jun. 19, 2018

(65) Prior Publication Data
US 2018/0302977 A1    Oct. 18, 2018

Related U.S. Application Data

(63) Continuation of application No. PCT/JP2016/087168, filed on Dec. 14, 2016.

(30) Foreign Application Priority Data

Jan. 7, 2016   (JP) .................................. 2016-001439

(51) Int. Cl.
*H05K 1/02* (2006.01)
*H05K 1/11* (2006.01)
(Continued)

(52) U.S. Cl.
CPC .......... *H05K 1/0206* (2013.01); *H01L 21/486* (2013.01); *H01L 21/4871* (2013.01);
(Continued)

(58) Field of Classification Search
CPC ........... H05K 1/02; H05K 1/201; H05K 1/05; H05K 1/0201–0207; H05K 1/185;
(Continued)

(56) References Cited

U.S. PATENT DOCUMENTS 4,663,497 A * 5/1987 Reimann ................ H05K 3/062
174/264
5,129,142 A * 7/1992 Bindra ................... H05K 3/445
174/262
(Continued)

FOREIGN PATENT DOCUMENTS

JP     59-158580 A    9/1984
JP   2001-168481 A    6/2001
(Continued)

OTHER PUBLICATIONS

Kawagoe, Atsuo, JP2015195304 Translation, published Nov. 5, 2015, full document (Year: 2015).*

(Continued)

*Primary Examiner* — Daniel P Wicklund
*Assistant Examiner* — Amir A Jalali
(74) *Attorney, Agent, or Firm* — Keating & Bennett, LLP

(57) ABSTRACT

A multilayer substrate includes a base including insulating layers stacked on one another, a first principal surface, and a second principal surface, a heat transfer member extending through a first insulating layer nearest to the first principal surface, a second coefficient of thermal conductivity of a material of the heat transfer member is higher than a first coefficient of thermal conductivity of a material of the insulating layers, a first metal film adhered to the first principal surface, the first metal film overlapping the heat transfer member when viewed from the layer stacking direction, and a first joining member disposed between the heat transfer member and the first metal film and being made of a material with a coefficient of thermal conductivity which is higher than the first coefficient of thermal conductivity of the material of the insulating layers.

20 Claims, 7 Drawing Sheets

(51) Int. Cl.
*H05K 1/18* (2006.01)
*H05K 3/40* (2006.01)
*H05K 3/46* (2006.01)
*H01L 23/367* (2006.01)
*H01L 23/538* (2006.01)
*H01L 21/48* (2006.01)
*H01L 21/145* (2006.01)
*H01L 23/373* (2006.01)
*H01L 23/498* (2006.01)
*H01L 23/14* (2006.01)

(52) U.S. Cl.
CPC ........ *H01L 23/145* (2013.01); *H01L 23/3677* (2013.01); *H01L 23/3735* (2013.01); *H01L 23/49838* (2013.01); *H01L 23/5389* (2013.01); *H05K 1/0204* (2013.01); *H05K 1/115* (2013.01); *H05K 1/181* (2013.01); *H05K 3/4069* (2013.01); *H05K 3/4644* (2013.01); *H01L 21/4857* (2013.01); *H01L 23/49822* (2013.01); *H01L 23/49827* (2013.01); *H01L 2224/16225* (2013.01); *H01L 2224/18* (2013.01); *H05K 1/185* (2013.01); *H05K 3/4632* (2013.01); *H05K 2201/0129* (2013.01); *H05K 2201/0195* (2013.01); *H05K 2201/049* (2013.01); *H05K 2201/068* (2013.01); *H05K 2201/10378* (2013.01); *H05K 2201/10416* (2013.01); *H05K 2201/10969* (2013.01)

(58) Field of Classification Search
CPC .... H05K 1/0209; H05K 1/0271; H05K 1/111; H05K 1/142; H05K 1/181; H05K 1/183; H05K 1/0298; H05K 1/0212; H05K 1/115; H05K 1/186; H05K 3/0044; H05K 3/0061; H05K 3/0094; H05K 3/32; H05K 3/429; H05K 3/4069; H05K 3/4632; H05K 3/4644; H05K 2201/06; H05K 2201/0129; H05K 2201/0195; H05K 2201/049; H05K 2201/068; H05K 2201/10378; H05K 2201/10416; H05K 2201/10969; H05K 2201/09545; H05K 2201/09772; H01L 21/486; H01L 21/4871; H01L 23/145; H01L 23/3677; H01L 23/3735; H01L 23/49822; H01L 23/49827; H01L 23/49839; H01L 2023/4062; H01L 2224/16225; H01L 224/18

USPC .......................... 361/719, 761; 174/252, 262
See application file for complete search history.

(56) References Cited

U.S. PATENT DOCUMENTS

| | | | |
|---|---|---|---|
| 6,440,542 B1 | 8/2002 | Kariya | |
| 7,253,023 B2 * | 8/2007 | Kusagaya | H05K 3/4602 438/106 |
| 7,446,263 B2 * | 11/2008 | En | C25D 3/38 174/258 |
| 7,851,708 B2 * | 12/2010 | Sakai | H01L 23/49822 174/255 |
| 7,936,567 B2 * | 5/2011 | Takashima | H01L 21/4857 361/761 |
| 9,136,212 B2 * | 9/2015 | Kato | H01L 23/49822 |
| 9,167,702 B2 * | 10/2015 | Suzuki | H05K 1/185 |
| 9,673,162 B2 * | 6/2017 | Viswanathan | H01L 24/32 |
| 9,769,917 B2 * | 9/2017 | Sakai | H05K 1/0278 |
| 2003/0002260 A1 | 1/2003 | Hasebe et al. | |
| 2008/0017409 A1 | 1/2008 | Takeuchi et al. | |
| 2011/0038132 A1 * | 2/2011 | Ochiai | B81C 1/00269 361/760 |
| 2011/0115001 A1 * | 5/2011 | Fujii | H01L 23/3677 257/288 |
| 2013/0256000 A1 * | 10/2013 | Terui | H05K 1/0298 174/251 |
| 2016/0043024 A1 * | 2/2016 | Furutani | H01L 23/49827 361/783 |
| 2016/0172287 A1 * | 6/2016 | Arisaka | H05K 1/11 257/774 |

FOREIGN PATENT DOCUMENTS

| | | |
|---|---|---|
| JP | 2003-046022 A | 2/2003 |
| JP | 2003-060523 A | 2/2003 |
| JP | 2005-051088 A | 2/2005 |
| JP | 2007-324550 A | 12/2007 |
| JP | 2011-108838 A | 6/2011 |
| JP | 2015-195304 A | 11/2015 |

OTHER PUBLICATIONS

Official Communication issued in International Patent Application No. PCT/JP2016/087168, dated Mar. 7, 2017.

* cited by examiner

Sp : H1~H4

22 : 22a~22d

22:22a~22e

MULTILAYER SUBSTRATE, ELECTRONIC DEVICE, AND A METHOD FOR MANUFACTURING A MULTILAYER SUBSTRATE

CROSS REFERENCE TO RELATED APPLICATIONS

This application claims the benefit of priority to Japanese Patent Application No. 2016-001439 filed on Jan. 7, 2016 and is a Continuation Application of PCT Application No. PCT/JP2016/087168 filed on Dec. 14, 2016. The entire contents of each application are hereby incorporated herein by reference.

BACKGROUND OF THE INVENTION

1. Field of the Invention

The present invention relates to a multilayer substrate, an electronic device, and a method for manufacturing a multilayer substrate, and more particularly to a multilayer substrate including insulating layers of thermoplastic resin stacked on one another, an electronic device, and a method for manufacturing a multilayer substrate.

2. Description of the Related Art

An example of a conventional multilayer substrate is a wireless communication module disclosed in Japanese Patent Application Publication 2003-60523. FIG. 7 is a sectional view of the wireless communication module 500 disclosed in Japanese Patent Application Publication 2003-60523.

The wireless communication module 500 includes a multilayer substrate 502 and a main board 504. The multilayer substrate 502 is mounted on the main board 504. The multilayer substrate 502 includes a body 506, a passive element 508, a heatsink 510, and a back-side electrode 512. The body 506 is composed of a plurality of dielectric layers stacked on one another in an up-down direction. The passive element 508 is disposed in a space inside the body 506. The heatsink 510 covers the passive element 508 from below so that the passive element 508 will not be exposed to the outside. The back-side electrode 512 covers the entire lower surface of the heatsink.

In the communication module 500, the back-side electrode 512 is soldered to an external electrode of the main board 504. Accordingly, heat generated by the passive element 508 is transferred to the main board 504 via the heatsink 510 and the back-side electrode 512.

The inventors of preferred embodiments of the present invention discovered a problem in the wireless communication module 500 that the heatsink 510 is easily dropped or detached from the body 506.

SUMMARY OF THE INVENTION

Preferred embodiments of the present invention provide multilayer substrates wherein a drop or detachment of a heat transfer member from a base is prevented, and also provide electronic devices, and methods for manufacturing multilayer substrates.

A multilayer substrate according to a preferred embodiment of the present invention includes a base including a plurality of insulating layers stacked on one another in a layer stacking direction, a first principal surface, and a second principal surface, the plurality of insulating layers being made of a material including thermoplastic resin; a heat transfer member extending through at least a first insulating layer of the plurality of insulating layers that is located nearest to the first principal surface, the heat transfer member being made of a material with a second coefficient of thermal conductivity which is higher than a first coefficient of thermal conductivity of the material of the plurality of insulating layers; a first metal film adhered to the first principal surface, the first metal film overlapping the heat transfer member when viewed from the layer stacking direction; a first joining member disposed between the heat transfer member and the first metal film, the first joining member being made of a material with a third coefficient of thermal conductivity which is higher than the first coefficient of thermal conductivity of the material of the plurality of insulating layers; and a via-hole conductor. The material of the first joining member and the material of the via-hole conductor include tin. A thickness, which is a dimension in the layer stacking direction, of the first joining member is smaller than a thickness of the first insulating layer.

An electronic device according to a preferred embodiment of the present invention includes a mother board and a multilayer substrate. The multilayer substrate includes a base including a plurality of insulating layers stacked on one another in a layer stacking direction, a first principal surface, and a second principal surface, the plurality of insulating layers being made of a material including thermoplastic resin; a heat transfer member extending through at least a first insulating layer of the plurality of insulating layers that is located nearest to the first principal surface, the heat transfer member being made of a material with a second coefficient of thermal conductivity which is higher than a first coefficient of thermal conductivity of the material of the plurality of insulating layers; a first metal film adhered to the first principal surface, the first metal film overlapping the heat transfer member when viewed from the layer stacking direction; a first joining member disposed between the heat transfer member and the first metal film, the first joining member being made of a material with a third coefficient of thermal conductivity which is higher than the first coefficient of thermal conductivity of the material of the plurality of insulating layers; and a via-hole conductor. The material of the first joining member and the material of the via-hole conductor include tin. A thickness, which is a dimension in the layer stacking direction, of the first joining member is smaller than a thickness of the first insulating layer. The first metal film is connected to the mother board.

A method for manufacturing a multilayer substrate according to a preferred embodiment of the present invention is a method for manufacturing a multilayer substrate including a plurality of insulating layers stacked on one another in a layer stacking direction, and a via-hole conductor. The method includes a first step of making a through-hole in a first insulating layer with a first metal film formed on a first principal surface such that the through-hole extends through the first insulating layer but does not extend through the first metal film, the first insulating layer being one of the plurality of insulating layers, the first principal surface being at an end in a first direction along the layer stacking direction; a second step of positioning a heat transfer member with a first joining member between the heat transfer member and the first metal film; and a third step of thermocompression bonding the plurality of insulating layers including the first insulating layer with the first insulating layer positioned at the end in the first direction along the layer stacking direction. A material of the first joining member and a material of the via-hole conductor include tin. The heat transfer member is made of a material with a second coefficient of thermal conductivity which is higher than a first coefficient of thermal conductivity of a material of the first insulating layer. The first joining member is made of a material with a third coefficient of thermal conductivity which is higher than the first coefficient of thermal conductivity.

Preferred embodiments of the present invention prevent a drop or detachment of a heat transfer member from a base.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
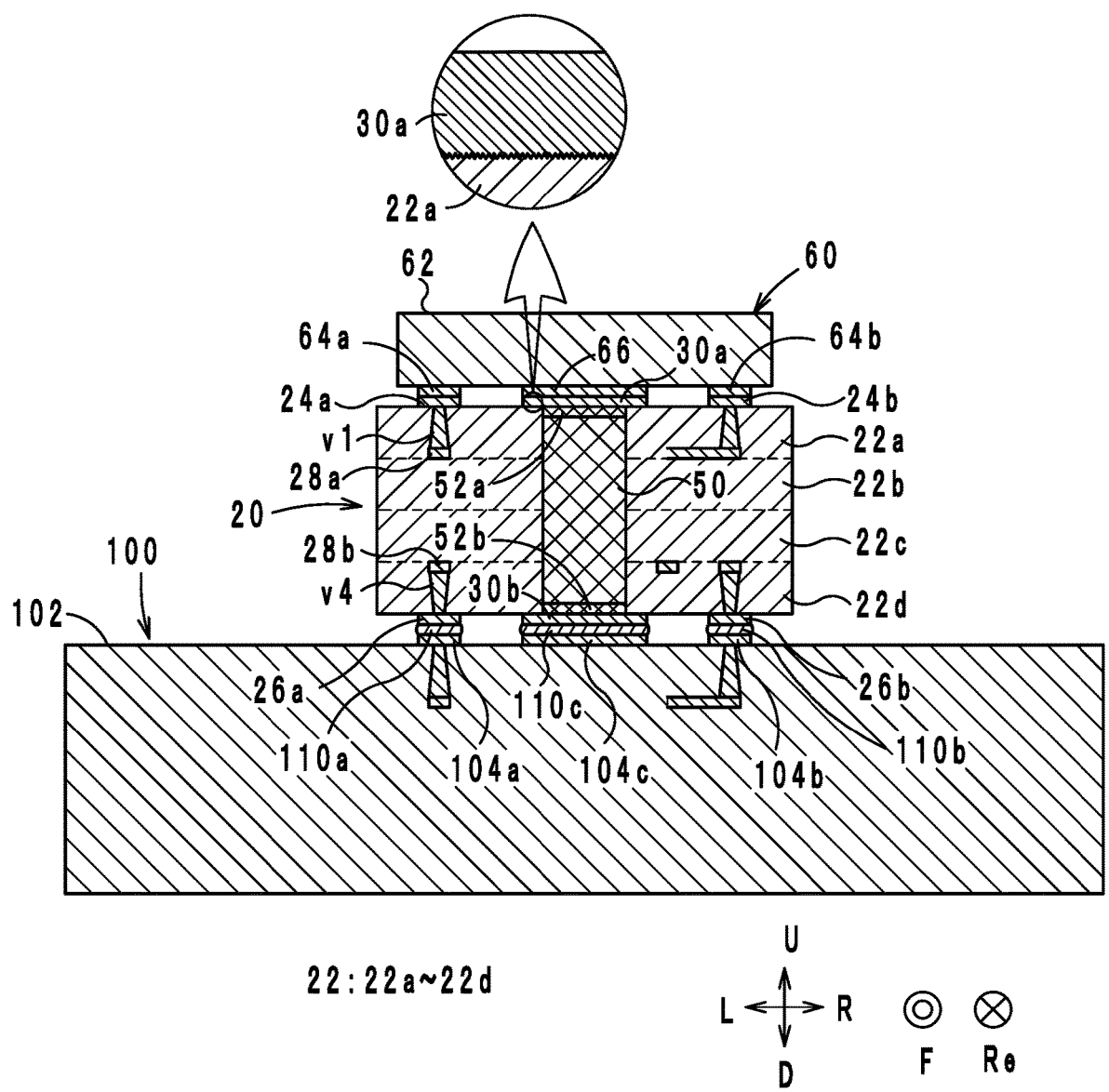
FIG. 1 is a sectional view showing the structure of an electronic device 10 according to a preferred embodiment of the present invention.
Figure 2:
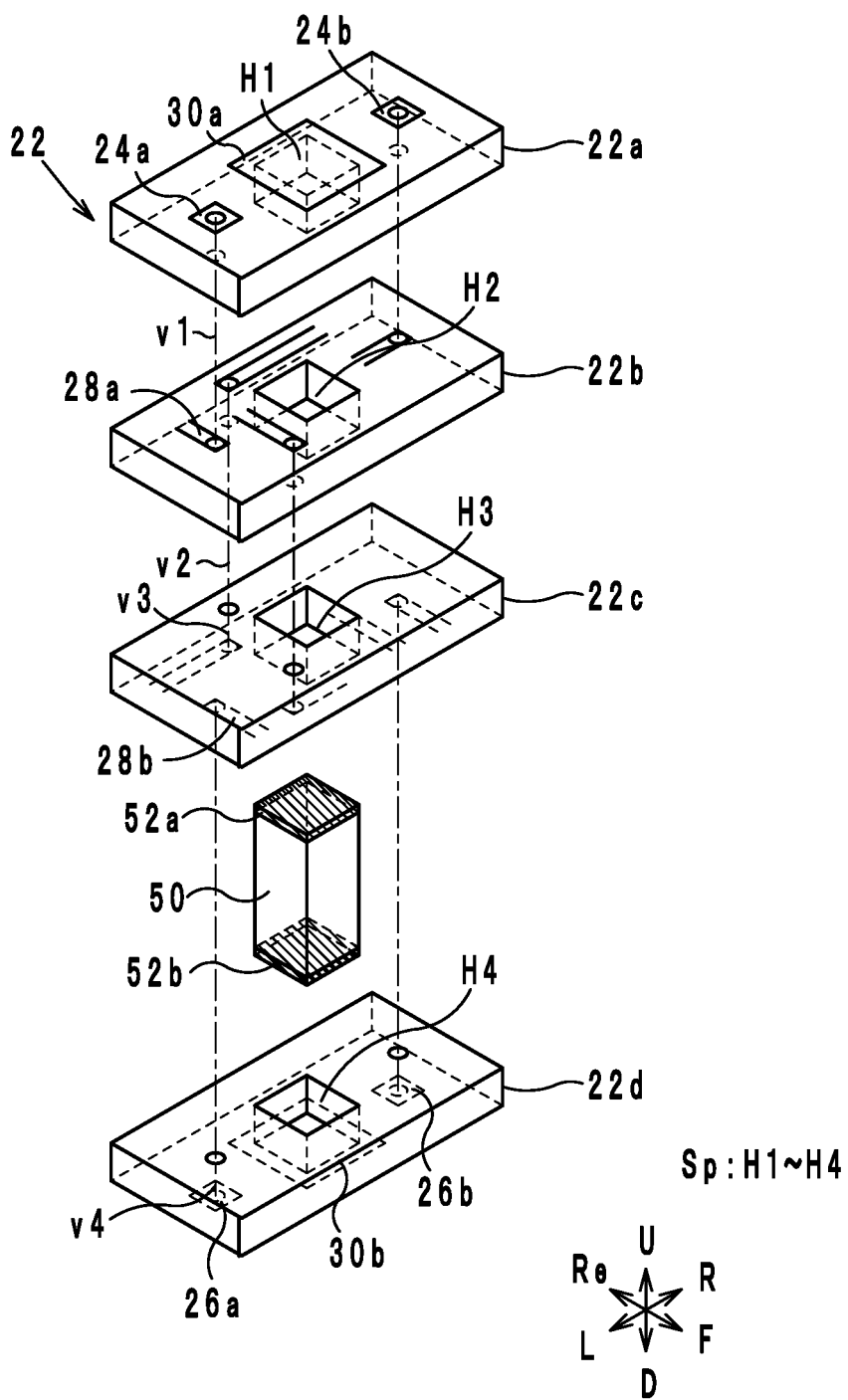
FIG. 2 is an exploded perspective view of a multilayer substrate 20.

The structures of multilayer substrates and electronic devices according to preferred embodiments of the present invention will hereinafter be described in reference to the drawings. FIG. 1 is a sectional view showing the structure of an electronic device 10 according to a preferred embodiment of the present. FIG. 2 is an exploded perspective view of the multilayer substrate 20. FIG. 2 does not show an electronic component 60. In the following description, the direction in which layers of the multilayer substrate 20 are stacked on one another will be referred to as an up-down direction. When the multilayer substrate 20 is viewed in the up-side direction, a direction in which long sides extend will be referred to as a right-left direction, and a direction in which short sides extend will be referred to as a front-rear direction. The up-down direction, the right-left direction and the front-rear direction are perpendicular or substantially perpendicular to one another.

The electronic device 10 is preferably, for example, a cellphone, a personal computer, a game machine, a wearable terminal, or other suitable device. FIG. 1 shows only a module disposed in the electronic device 10, and the casing and other members of the electronic device 10 are not shown in FIG. 1. The electronic device 10, as shown in FIG. 1, includes the multilayer substrate 20 and a mother board 100. In the drawings, insulating sheets 22a to 22d are drawn as being thicker than the actual thickness for the sake of convenience for description.

First, the multilayer substrate 20 will be described. The multilayer substrate 20 is a flexible board which is rectangular or substantially rectangular when viewed from above. As shown in FIG. 2, the multilayer substrate 20 includes a base 22, external electrodes 24a, 24b, 26a and 26b, circuit conductor layers 28a and 28b, via-hole conductors v1 to v4, a heat transfer member 50, joining members 52a and 52b, and an electronic component 60. Other external electrodes are provided in addition to the external electrodes 24a, 24b, 26a and 26b, but the external electrodes except for the external electrodes 24a, 24b, 26a and 26b are not shown in FIGS. 1 and 2. Similarly, other circuit conductor layers are provided in addition to the circuit conductor layers 28a and 28b, but the circuit conductor layers except for the circuit conductor layers 28a and 28b are not shown in FIGS. 1 and 2. Similarly, other via-hole conductors are provided in addition to the via-hole conductors v1 to v4, but the via-hole conductors except for the via-hole conductors v1 to v4 are not shown in FIGS. 1 and 2. Also, in FIGS. 1 and 2, only representative circuit conductor layers are provided with the reference numbers 28a and 28b, and only representative via-hole conductors are provided with the reference numbers v1 to v4.

As shown in FIG. 2, the base 22 is preferably a flexible plate member that is rectangular or substantially rectangular when viewed from above. The base 22 is a laminated body including insulating sheets 22a to 22d (an example of a plurality of insulating layers) stacked in this order from top to bottom. The base 22 includes two principal surfaces. In the following description, the upper principal surface of the base 22 will be referred to as a front surface (an example of a second principal surface), and the lower principal surface of the base 22 will be referred to as a back surface (an example of a first principal surface). The back surface of the base 22 is a mounting surface to face the mother board 100 when the multilayer substrate 20 is mounted on the mother board 100.

When viewed from above, each of the insulating sheets 22a to 22d is preferably rectangular or substantially rectangular and has the same or substantially the same shape as the base 22. The insulating sheets 22a to 22d are preferably made of a flexible material including thermoplastic resin, such as polyimide, liquid polymer, or other suitable material, for example. In the following description, the upper principal surface of each of the insulating sheets 22a to 22d will be referred to as a front surface, and the lower principal surface of each of the insulating sheets 22a to 22d will be referred to as a back surface.

The insulating sheets 22a to 22d include through-holes H1 to H4 which are preferably rectangular or substantially rectangular when viewed from above, respectively, in their respective centers (around the respective intersections of diagonal lines). The through-holes H1 to H4 connect the front and back surfaces of the respective insulating sheets 22a to 22d. The outlines of the through-holes H1 to H4 coincide with one another when viewed from above. Accordingly, the through-holes H1 to H4 are connected to become one.

The external electrode 30a (an example of a second metal film) is preferably a rectangular or substantially rectangular conductor layer and is disposed on the front surface of the insulating sheet 22a. When viewed from above, the external electrode 30a covers the entire or substantially the entire through-hole H1 from above and extends from the through-hole H1 outward. As shown in the enlarged view of FIG. 1, the surface roughness of the surface of the external electrode 30a in contact with the insulating sheet 22a is greater than the surface roughness of the surface of the external electrode 30a out of contact with the insulating sheet 22a. Accordingly, the external electrode 30a adheres to the front surface of the base 22 by an anchor effect. In this regard, the material of the base 22 moves into the asperities of the external electrode 30a, and thus, the external electrode 30a physically adheres to the base 22 (insulating sheet 22a). Thus, the external electrode 30a and the base 22 (insulating sheet 22a) are not chemically bound. Therefore, at the boundary between the external electrode 30a and the base 22, almost no extraneous substances, such as resin and other constituents of an adhesive, for example, are present.

The external electrode 30b (an example of a first metal film) is preferably a rectangular or substantially rectangular conductor layer and is disposed on the back surface of the insulating sheet 22d. When viewed from above, the external electrode 30b covers the entire or substantially the entire through-hole H4 from below and extends from the through-hole H4 outward. The surface roughness of the surface of the external electrode 30b in contact with the insulating sheet 22d is greater than the surface roughness of the surface of the external electrode 30b out of contact with the insulating sheet 22d. Accordingly, the external electrode 30b adheres to the back surface of the base 22 by an anchor effect. In this regard, the material of the base 22 moves into the asperities of the external electrode 30b, and thus, the external electrode 30b physically adheres to the base 22 (insulating sheet 22d). Thus, the external electrode 30b and the base 22 (insulating sheet 22d) are not chemically bound. Therefore, at the boundary between the external electrode 30b and the base 22, almost no extraneous substances, such as resin and other constituents of an adhesive, for example, are present.

Since the external electrodes 30a and 30b are provided, a space Sp enclosed by the inner walls of the thorough-holes H1 to H4 and the external electrodes 30a and 30b is provided in the base 22.

The external electrodes 30a and 30b are preferably made of copper, for example. However, the surfaces of the external electrodes 30a and 30b are galvanized to decrease the surface roughness.

As shown in FIGS. 1 and 2, the heat transfer member 50 is a metal block which is in the shape of a cuboid extending in the up-down direction, and the heat transfer member 50 is disposed in the space Sp. Thus, the heat transfer member 50 extends through the insulating sheets 22a to 22d in the up-down direction. Accordingly, the heat transfer member 50 extends through the insulating sheet 22a (an example of a second insulating layer which is one of the plurality of insulating layers and is located nearest to the second principal surface) and the insulating sheet 22d (an example of a first insulating layer which is one of the plurality of insulating layers and is located nearest to the first principal surface) in the up-down direction. Also, the insulating sheets 22a to 22d adhere to the heat transfer member 50. More specifically, the insulating sheets 22a to 22d are softened and thereafter solidified in a thermocompression bonding process to form the base 22 as will be described later. Therefore, when the insulating sheets 22a to 22d are softened, the resin included in the insulating sheets 22a to 22d flows into the gap between the inner walls of the through-holes H1 to H4 and the front, rear, right and left sides (which will hereinafter be referred to as side surfaces) of the heat transfer member 50, and the gap is filled with the insulating sheets 22a to 22d. Further, when the insulating sheets 22a to 22d are solidified, the inner walls of the through holes H1 to H4 and the side surfaces of the heat transfer member 50 stick together and become hard to separate from each other. Thus, the side surfaces of the heat transfer member 50 are held by the insulating sheets 22a to 22d.

The upper surface of the heat transfer member 50 is positioned near the front surface of the base 22, and the lower surface of the heat transfer member 50 is positioned near the back surface of the base 22. As mentioned above, the external electrodes 30a and 30b extend from the through-holes H1 and H4 outward, respectively, when viewed from above or below. Accordingly, the external electrode 30a covers the entire or substantially the entire upper surface of the heat transfer member 50 when viewed from above. The outline of the upper surface of the heat transfer member 50 is within the outline of the external electrode 30a when viewed from above. Similarly, the external electrode 30b covers the entire or substantially the entire lower surface of the heat transfer member 50 when viewed from below. The outline of the lower surface of the heat transfer member 50 is within the outline of the external electrode 30b when viewed from below.

The heat transfer member 50 having the above-described structure is preferably made of a material having a coefficient of thermal conductivity E2 (an example of a second coefficient of thermal conductivity) which is higher than the coefficient of thermal conductivity E1 (an example of a first coefficient of thermal conductivity) of the material of the insulating sheets 22a to 22d. In the present preferred embodiment, the heat transfer member 50 is preferably made of copper, for example, which is the same material as the external electrodes 30a and 30b. However, the heat transfer member 50 may be a block made of a conductive material, such as gold, aluminum, silver, or any other metal, or a non-conductive material, such as a carbon material, a ceramic material, or other suitable materials. The heat transfer member 50 is preferably not a combined member including a combination of conductors extending through the insulating sheets 22a to 22d and conductor layers disposed on the insulating sheets 22a to 22d, but is preferably a single member made of one material. Also, the concept of the heat transfer member 50 does not include via-hole conductors and other interlayer connection conductors.

The joining member 52a (an example of a second joining member) is disposed between the heat transfer member 50 and the external electrode 30a, and the joining member 52a is preferably made of a material having a coefficient of thermal conductivity E4 (an example of a fourth coefficient of thermal conductivity) which is higher than the coefficient of thermal conductivity E1 (an example of a first coefficient of thermal conductivity) of the material of the insulating sheets 22a to 22d. The joining member 52a is preferably made of a conductive material including tin, for example. In the present preferred embodiment, the joining member 52a is preferably a tin-plated film covering the entire or substantially the entire upper surface of the heat transfer member 50. In the thermocompression bonding process to form the base 22 which will be described later, tin atoms in the joining member 52a are dispersed into the external electrode 30a, and copper atoms in the external electrode 30a are dispersed into the joining member 52a. Thus, a solid-phase diffusion layer is formed at the boundary between the joining member 52a and the external electrode 30a. Consequently, solid-phase diffusion bonding occurs between the joining member 52a and the external electrode 30a, and no gap is present between the joining member 52a and the external electrode 30a. Similarly, a solid-phase diffusion layer is formed at the boundary between the joining member 52a and the heat transfer member 50.

The joining member 52b (an example of a first joining member) is disposed between the heat transfer member 50 and the external electrode 30b, and the joining member 52b is preferably made of a material having a coefficient of thermal conductivity E3 (an example of a third coefficient of thermal conductivity) which is higher than the coefficient of thermal conductivity E1 (an example of a first coefficient of thermal conductivity) of the material of the insulating sheets 22a to 22d. The joining member 52b is preferably made of a conductive material including tin, for example. In the present preferred embodiment, the joining member 52b is preferably a tin-plated film covering the entire or substantially entire lower surface of the heat transfer member 50. In the thermocompression bonding process to form the base 22 which will be described later, tin atoms in the joining member 52b are dispersed into the external electrode 30b, and copper atoms in the external electrode 30b are dispersed into the joining member 52b. Thus, a solid-phase diffusion layer is formed at the boundary between the joining member 52b and the external electrode 30b. Consequently, solid-phase diffusion bonding occurs between the joining member 52b and the external electrode 30b, and no gap is present between the joining member 52b and the external electrode 30b. Similarly, a solid-phase diffusion layer is formed at the boundary between the joining member 52b and the heat transfer member 50.

The joining members 52a and 52b are preferably plated films as mentioned above, and therefore, the joining members 52a and 52b have a small thickness (dimension in the up-down direction). The thicknesses (dimensions in the up-down direction) of the joining members 52a and 52b are smaller than the thicknesses (dimensions in the up-down direction) of the insulating sheets 22a and 22d. The joining members 52a and 52b are thin, and the concept of the joining members 52a and 52b does not include via-hole conductors and any other interlayer connection conductors.

The external electrodes 24a and 24b are preferably rectangular or substantially rectangular conductor layers and are disposed on the front surface of the insulating sheet 22a. The external electrode 24a is positioned at the left side of the through-hole H1 when viewed from above. The external electrode 24b is positioned at the right side of the through-hole H1 when viewed from above.

The external electrodes 26a and 26b are preferably rectangular or substantially rectangular conductor layers and are disposed on the back surface of the insulating sheet 22d. The external electrode 26a is positioned at the left side of the through-hole H4 when viewed from below. The external electrode 26b is positioned at the right side of the through-hole H4 when viewed from below.

The circuit conductor layers 28a and 28b are conductor layers disposed inside the base 22 to define a portion of a circuit inside the multilayer substrate 20. The circuit conductor layers 28a and 28b shown in FIG. 2 are linear traces, but they may be, for example, rectangle-shaped planar capacitor conductors, or other suitable shaped conductors. The circuit conductor layers 28a are disposed on the surface of the insulating sheet 22b. The circuit conductor layers 28b are disposed on the back surface of the insulating sheet 22c.

The via-hole conductors v1 to v4 are interlayer connection conductors which extend through the insulating sheets 22a to 22d, respectively, in the up-side direction. Each of the via-hole conductors v1 and v2 increases in diameter from the top downward. Each of the via-hole conductors v3 and v4 decreases in diameter from the top downward. The via-hole conductors v1 connect the external electrodes 24a and 24b to the circuit conductor layers 28a. The via-hole conductors v2 connect the circuit conductor layers 28a to the via-hole conductors v3. The via-hole conductors v3 connect the via-hole conductors v2 to the circuit conductor layers 28b. The via-hole conductors v4 connect the circuit conductor layers 28b to the external electrodes 26a and 26b. Thus, the external electrode 24a is electrically connected to the external electrode 26a, and the external electrode 24b is electrically connected to the external electrode 26b.

The circuit conductor layers 28a and 28b and the external electrodes 24a, 24b, 26a and 26b are preferably made of copper, for example. However, the surfaces of the circuit conductor layers 28a and 28b and the external electrodes 24a, 24b, 26a and 26d are galvanized. The via-hole conductors v1 to v4 are preferably made by solidifying a conductive paste primarily including copper, tin, silver, or other metal, for example.

The electronic component 60 is mounted on the front surface of the base 22, and is preferably a semiconductor integrated circuit, for example. The electronic component 60 may be a chip electronic component, such as a capacitor, an inductor, or other suitable components, for example. The electronic component 60 includes a body 62, and external electrodes 64a, 64b and 66. The body 62 is preferably in the shape of a cuboid. The external electrodes 64a, 64b and 66 are disposed on the lower surface of the body 62 and are arranged in a row from left to right in this order. The external electrodes 64a, 64b and 66 are connected to the external electrodes 24a, 24b and 30a, respectively, by ultrasonic joining, for example. However, solder, a conductive adhesive or any other conductive joining material may be used to mount the electronic component 60. Thus, the electronic component is physically and electrically connected to the external electrode 30a.

Next, the mother board 100 will be described. The mother board 100 is a large-sized circuit board which is, for example, provided in a cell phone or other device. The mother board 100 is preferably an inflexible rigid board, but the mother board 100 may be flexible. The mother board 100 includes a body 102, and external electrodes 104a to 104c. The body 102 is preferably a multilayer substrate which is rectangular or substantially rectangular when viewed from above. Electric circuits are provided inside the body 102 and on the surface of the body 102. In the following description, the upper principal surface of the body 102 will be referred to as a front surface, and the lower principal surface of the body 102 will be referred to as a back surface.

The external electrodes 104a to 104c are preferably rectangular or substantially rectangular conductor layers and are disposed on the front surface of the body 102. The external electrodes 104a, 104c and 104b are arranged in a row from left to right in this order. The mother board 100 may include other external electrodes (not shown) in addition to the external electrodes 104a to 104c.

The multilayer substrate 20 is mounted on the front surface of the mother board 100. More specifically, the external electrodes 26a and 26b are connected to the external electrodes 104a and 104b by solder 110a and 110b, respectively. The external electrode 30b is connected to the external electrode 104 by solder 110c. Thus, the external electrode 30b is connected to the mother board 100.

In the electronic device 10, the external electrodes 30a and 30b, the heat transfer member 50, and the joining members 52a and 52b define an electric current pathway. More specifically, the external electrode 30a is connected to the external electrode 66, and the external electrode 30b is connected to the external electrode 104c via the solder 110c. Thus, the electronic device 60 and the mother board 100 are electrically connected to each other via the external electrodes 30a and 30b, the heat transfer member 50, and the joining members 52a and 52b. Accordingly, signals are able to be sent from the electronic device 60 to the mother board 100 and from the mother board 100 to the electronic device 60. When the external electrode 104c is not an input/output electrode but a ground electrode, the external electrodes 30a, 30b and 66, the heat transfer member 50, and the joining members 52a and 52b are maintained at the ground potential. In the electronic device 10, however, the external electrodes 30a and 30b, the heat transfer member 50, and the joining members 52a and 52b do not need to define an electric current pathway. When the external electrodes 30a and 30b, the heat transfer member 50, and the joining members 52a and 52b do not define an electric current pathway, heat generated by the electronic component 60 is transferred to the mother board 100 via the external electrodes 30a and 30b, the heat transfer member 50, and the joining members 52a and 52b as will be described later.

Figure 3:
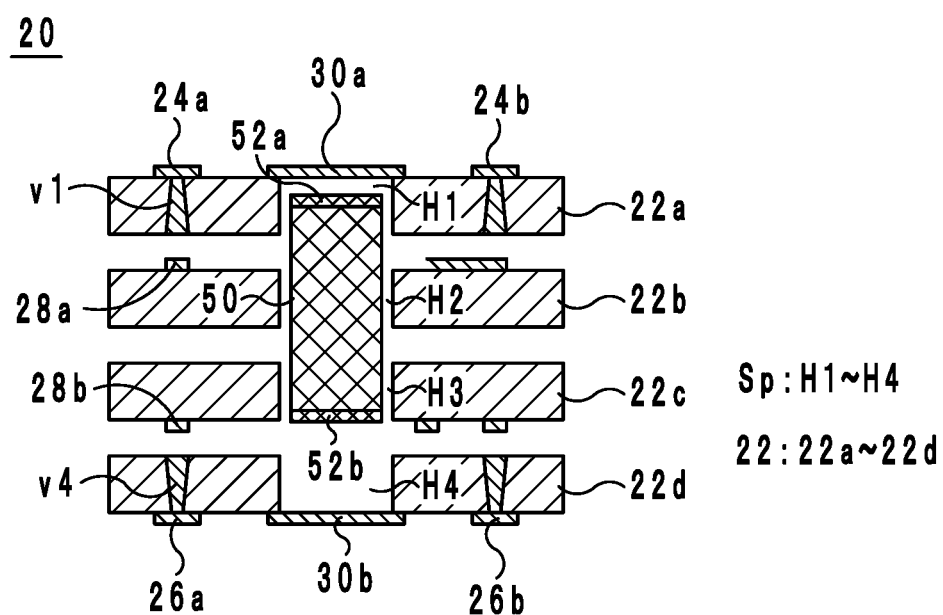
FIG. 3 is a sectional view of the multilayer substrate 20 at the time of manufacture.
Figure 3:
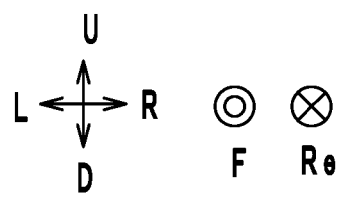

A method for manufacturing the multilayer substrate 20 and the electronic device 10 according to a preferred embodiment of the present invention will hereinafter be described with reference to the drawings. FIG. 3 is a sectional view of the multilayer substrate 20 at the time of manufacture. In the following, a case of manufacturing one multilayer substrate 20 will be described as an example. In practicality, however, large-sized insulating sheets are stacked and cut, and thus, a plurality of multilayer substrates 20 are manufactured at one time.

First, as the insulating sheets 22a to 22d, insulating sheets made of liquid polymer are prepared. Next, one principal surface of each of the insulating sheets 22a to 22d is entirely or substantially entirely covered with copper foil. Specifically, a sheet of copper foil is disposed on the front surface of each of the insulating sheets 22a and 22b. A sheet of copper foil is disposed on the back surface of each of the insulating sheets 22c and 22d. Further, the surfaces of the sheets of copper foil on the insulating sheets 22a to 22d are galvanized to resist or prevent corrosion, and thus, the copper foil surfaces are smoothened. Not only copper foil but also other metal foil may be used.

Next, through-holes H1 to H4 are formed in the insulating sheets 22a to 22d. The through-holes H1 to H4 are formed, for example, by irradiating the insulating sheets 22a and 22b with laser beams from the respective back surfaces and by irradiating the insulating sheets 22c and 22d with laser beams from the respective front surfaces. In this regard, the intensity of the laser beam is adjusted such that the through-holes H1 to H4 will not extend through the sheets of copper foil. By this process (an example of a first step), the through-hole H4 is formed in the insulating sheet 22d with a sheet of copper foil (an example of a first metal film) on the back surface such that the through-hole H4 extends through the insulating sheet 22d but does not extend through the sheet of copper foil.

Next, the copper foil on the front surface of the insulating sheet 22a is patterned, and thus, the external electrodes 24a, 24b and 30a shown in FIG. 3 are formed on the front surface of the insulating sheet 22a. Specifically, on the copper foil on the front surface of the insulating sheet 22a, resists having the same or substantially the same shapes as the external electrodes 24a, 24b and 30a are printed. Thereafter, the copper foil is etched, and the portions of the copper foil uncovered with the resists are removed. Thereafter, a cleaning solution (resist remover) is sprayed to remove the resists. Thus, the external electrodes 24a, 24b and 30a shown in FIG. 3 are formed on the front surface of the insulating sheet 22a by photolithography, for example.

Next, as shown in FIG. 3, the circuit conductor layers 28a and 28b are formed on the front surface of the insulating sheets 22b and the back surface of the insulating sheet 22c, respectively. Also, the external electrodes 26a, 26b and 30b shown in FIG. 3 are formed on the back surface of the insulating sheet 22d. The process of forming the circuit conductor layers 28a and 28b, and the process of forming the external electrodes 26a, 26b and 30b are the same or substantially the same as the process of forming the external electrodes 24a, 24b and 30a, and the processes will not be described. The process of forming the through-holes H1 to H4 may be performed after the processes of forming the external electrodes 24a, 24b, 26a, 26b, 30a and 30b and the circuit conductor layers 28a and 28b.

Next, the insulating sheets 22a to 22d are irradiated with laser beams such that through-holes are formed at positions at which the via-hole conductors v1 to v4 are to be formed. A conductive paste preferably primarily including copper, tin, silver, or other metal is filled in the through-holes.

Next, the heat transfer member 50 with the joining members 52a and 52b attached thereto is prepared. In the present preferred embodiment, the joining members 52a and 52b are formed by plating the upper surface and the lower surface of the heat transfer member 50 with tin.

Next, the insulating sheets 22b to 22d are stacked, and thereafter, the heat transfer member 50 is inserted into the through holes H2 to H4 from above. Then, the insulating sheet 22a is disposed on the insulating sheet 22b. By this process (an example of a second step), the heat transfer member 50 is positioned in the space Sp of the base 22 with the joining member 52a (an example of a second joining member) disposed between the upper surface of the heat transfer member 50 and the external electrode 30a (an example of a second metal film) and with the joining member 52b (an example of a first joining member) disposed between the lower surface of the heat transfer member 50 and the external electrode 30b (an example of a first metal film).

Next, the multilayer substrate 20 is formed by thermocompression bonding. Specifically, as shown in FIG. 3, while the insulating sheets 22a to 22d are stacked in this order from top to bottom (that is, with the insulating sheet 22a positioned in the uppermost position (at an end in a second direction along the layer stacking direction) and with the insulating sheet 22d positioned in the lowermost position (at an end in a first direction along the layer stacking direction)), the insulating sheets 22a to 22d are bonded together by thermocompression bonding (an example of a third step). During the thermocompression bonding of the insulating sheets 22a to 22d, the insulating sheets 22a to 22d are softened, and the conductive paste in the through-holes are solidified. Thus, the insulating sheets 22a to 22d are bonded together, and the via-hole conductors v1 to v4 are formed. Further, during the thermocompression bonding, the thermoplastic resin in the insulating sheets 22a to 22d is softened and flows in the gap between the inner walls of the through-holes H1 to H4 and the side surfaces of the heat transfer members 50. Thereafter, when the insulating sheets 22a to 22d are cooled, the thermoplastic resin is solidified, and the inner walls of the through-holes H1 to H4 adhere to the side surfaces of the heat transfer member 50. Also, tin atoms in the joining members 52a and 52b are dispersed into the external electrodes 30a and 30b respectively, and copper atoms in the external electrodes 30a and 30b are dispersed into the joining members 52a and 52b, respectively. Thus, at the boundary between the joining member 52a and the external electrode 30a and at the boundary between the joining member 52b and the external electrode 30b, solid-phase diffusion layers are formed. Similarly, at the boundary between the joining member 52a and the heat transfer member 50 and at the boundary between the joining member 52b and the heat transfer member 50, solid-phase diffusion layers are formed.

Next, the electronic component 60 is mounted on the base 22 by ultrasonic joining. In this manner, the multilayer substrate 20 shown in FIG. 1 is completed.

Lastly, the multilayer substrate 20 is mounted on the mother board 100 by soldering as shown in FIG. 1. Thereafter, the mother board 100 is housed in a casing, and thus, the electronic device 10 is completed.

In the multilayer substrate 20 according to the present preferred embodiment, the heat transfer member 50 is prevented from easily coming off or detaching from the base 22. More specifically, in the multilayer substrate 20, the heat transfer member 50 extends through at least the insulating sheet 22d, which is located nearest to the back surface of the base 22 among the insulating sheets 22a to 22d, in the up-down direction. The external electrode 30b adheres to the back surface of the base 22 and covers the heat transfer member 50 when viewed from below. Thus, the lower side of the heat transfer member 50 is covered with the external electrode 30b. Consequently, the heat transfer member 50 is prevented from easily coming off or detaching downward from the base 22. Similarly, since the upper side of the heat transfer member 50 is covered with the external electrode 30a, the heat transfer member 50 is prevented from easily coming off or detaching upward from the base 22.

In the multilayer substrate 20, also, the inner walls of the through-holes H1 to H4 adhere to the side surfaces of the heat transfer member 50. This further prevents the heat transfer member 50 from easily coming off or detaching from the base 22. In the multilayer substrate 20, the side surfaces of the heat transfer member 50 are planar or substantially planar. Therefore, the insulating sheets 22a to 22d easily stick to the side surfaces of the heat transfer member 50. Consequently, the heat transfer member 50 is more effectively prevented from coming off or detaching from the base 22.

The multilayer substrate 20 has a high capability of dissipating heat from the electronic component 60. More specifically, the joining member 52a intervenes between the heat transfer member 50 and the external electrode 30a, and the joining member 52a is made of a material with the coefficient of thermal conductivity E4, which is higher than the coefficient of thermal conductivity E1 of the insulating sheets 22a to 22d. This prevents a gap from being made between the heat transfer member 50 and the external electrode 30a. Thus, heat generated by the electronic component 60 is efficiently transferred from the external electrode 30a to the heat transfer member 50 via the joining member 52a.

The multilayer substrate 20 has a high capability of dissipating heat also from the multilayer substrate 20 itself. More specifically, the joining member 52b intervenes between the heat transfer member 50 and the external electrode 30b, and the joining member 52b is made of a material with the coefficient of thermal conductivity E3, which is higher than the coefficient of thermal conductivity E1 of the insulating sheets 22a to 22d. This prevents a gap from being provided between the heat transfer member 50 and the external electrode 30b. Thus, heat in the multilayer substrate 20 (heat generated by the multilayer substrate 20 and heat generated by the electronic component 60) is efficiently transferred from the heat transfer member 50 to the external electrode 30b via the joining member 52b.

The multilayer substrate 20 has a high capacity of dissipating heat from the multilayer substrate 20 and the electronic component 60 also for the following reason. More specifically, at the boundary between the heat transfer member 50 and the joining member 52a and at the boundary between the external electrode 30a and the joining member 52a, solid-phase diffusion layers are formed. Such a solid-phase diffusion layer is porous or has a non-homogeneous structure as compared to the heat transfer member 50. Therefore, the solid-phase diffusion layer on the heat transfer member 50 is likely to have a coefficient of thermal conductivity which is lower than the coefficient of thermal conductivity of the heat transfer member 50. In view of this, the joining member 52a is preferably a tin-plated film and is thinner than the insulating sheet 22a. This means minimizing the thickness of the portion with a low coefficient of thermal conductivity, and this results in a reduction or prevention of a decrease in heat dissipating capacity. The same applies to the joining member 52b. Since the joining members 52a and 52b are plated films, they are thin and flat. This decreases a risk of lowering the surface flatness of the front and back surfaces of the multilayer substrate 20.

In the multilayer substrate 20, since the heat transfer member 50 is preferably cuboid, the upper surface and the lower surface of the heat transfer member 50 are plane surfaces. Therefore, the front surface and the back surface of the multilayer substrate 20 have excellent surface flatness, which ensures the mounting of the electronic component 60 on the front surface of the base 22 and ensures the mounting of the multilayer substrate on the mother board 100. Also, it is easy to process the cuboidal heat transfer member 50.

In the multilayer substrate 20, the joining member 52b is able to be securely joined with the external electrode 30b. More specifically, the surface roughness of the surface of the external electrode 30b in contact with the insulating sheet 22d and the joining member 52b is greater than the surface roughness of the surface of the external electrode 30b out of contact with the insulating sheet 22d and the joining member 52b. Accordingly, the contact area between the external electrode 30b and the joining member 52b is large. Therefore, at the boundary between the external electrode 30b and the joining member 52b, solid-phase diffusion easily occurs, and accordingly, solid-phase diffusion bonding between the external electrode 30b and the joining member 52b easily occurs. Further, there is an anchor effect between the joining member 52b and the external electrode 30b. Consequently, the joining member 52b is able to be securely joined with the external electrode 30b. For the same reasons, the joining member 52a is able to be securely joined with the external electrode 30a.

Figure 4:
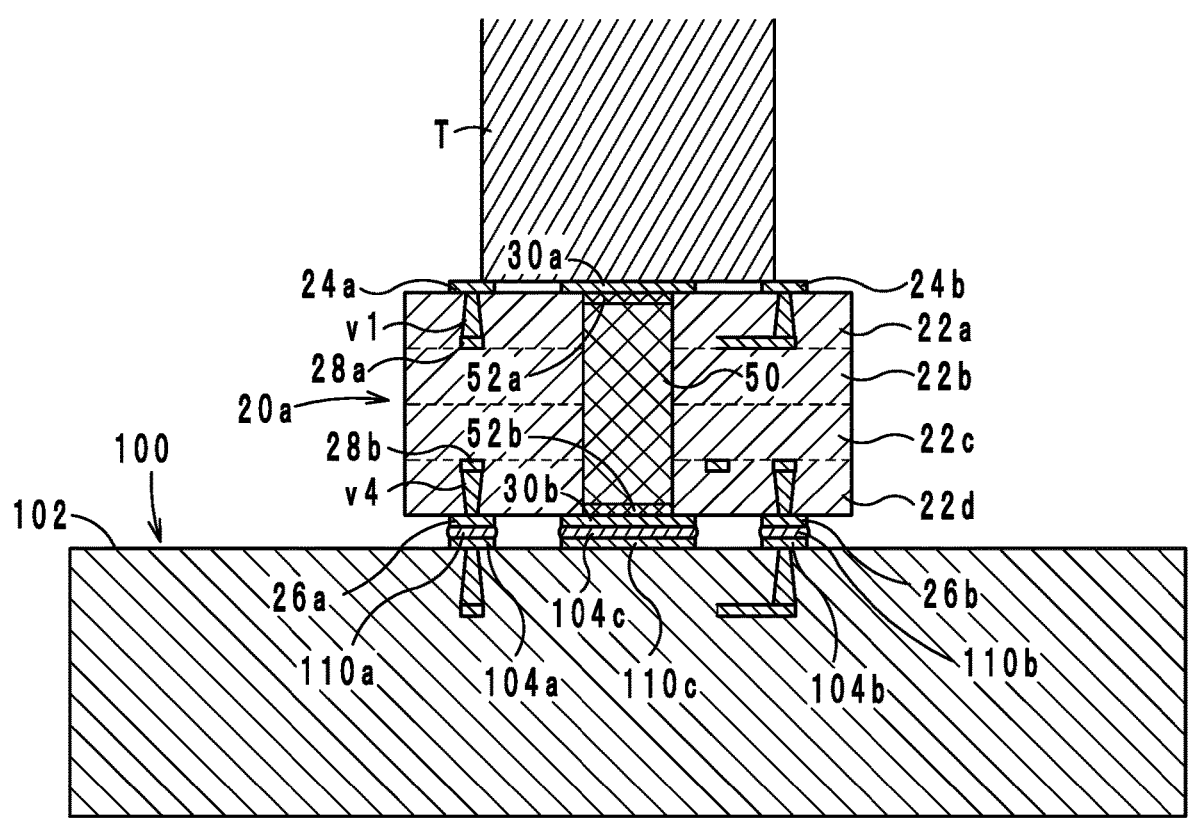
FIG. 4 is a sectional view of an electronic device 10a according to a first modification of a preferred embodiment of the present invention at the time of manufacture.

An electronic device 10a and a multilayer substrate 20a according to a first modification of a preferred embodiment of the present invention will be described below. FIG. 4 is a sectional view of the electronic device 10a according to the first modification at the time of manufacture.

The multilayer substrate 20a differs from the multilayer substrate 20 in the function of the heat transfer member 50. Specifically, in the electronic device 10 and the multilayer substrate 20, the heat transfer member 50 transfers heat generated by the electronic component 60 and the multilayer substrate 20 to the mother board 100. In the electronic device 10a and the multilayer substrate 20a, the heat transfer member 50 transfers heat to melt the solder 110c as well as transfers heat generated by the electronic component 60 and the multilayer substrate 20 to the mother board 100.

More specifically, to mount the base 22 on the mother board 100, a solder paste is applied onto the external electrode 104c, and thereafter, the multilayer substrate 20 is positioned such that the external electrode 30b faces the external electrode 104c. Then, the solder paste is heated and melted, and thereafter is cooled and solidified into the solder 110c. For the heating, as shown in FIG. 4, a heating tool T is pressed against the external electrode 30a, and the heating tool T is driven to generate heat. Then, the heat generated by the heating tool T is transferred to the solder paste via the external electrodes 30a and 30b, the heat transfer member 50 and the joining members 52a and 52b, and the solder paste is melted.

In the multilayer substrate 20a and the electronic device 10a, to mount the base 22, it is necessary to bring the heating tool T into contact with the external electrode 30a. Therefore, the electronic component 60 is mounted on the base 22 after the base 22 is mounted on the mother board 100. The electronic component 60 may be mounted in any other location than where the heating tool T is brought into contact with the base 22.

Figure 5:
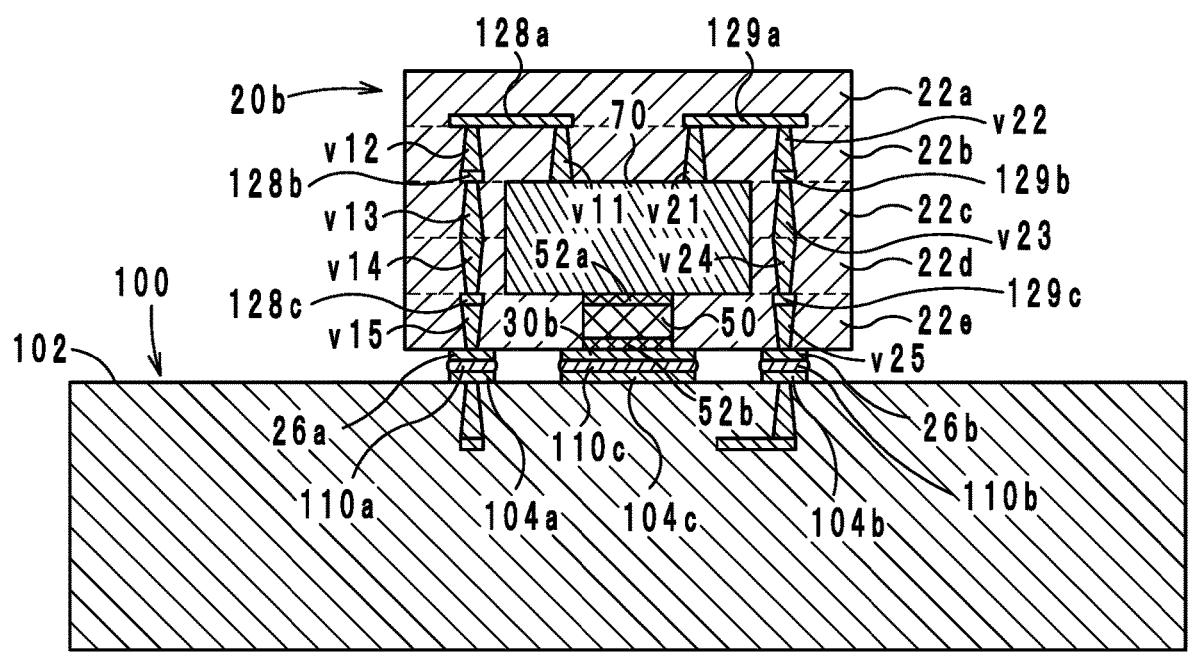
FIG. 5 is a sectional view showing the structure of an electronic device 10b according to a second modification of a preferred embodiment of the present invention.
Figure 6:
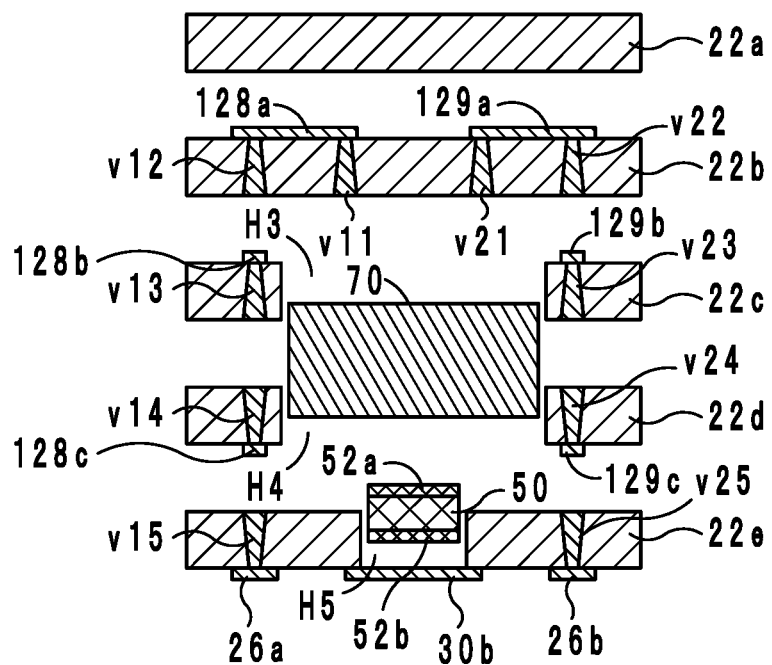
FIG. 6 is an exploded view of a multilayer substrate 20b according to the second modification.
Figure 6:
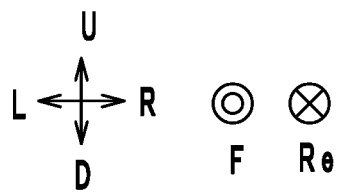
Figure 7:
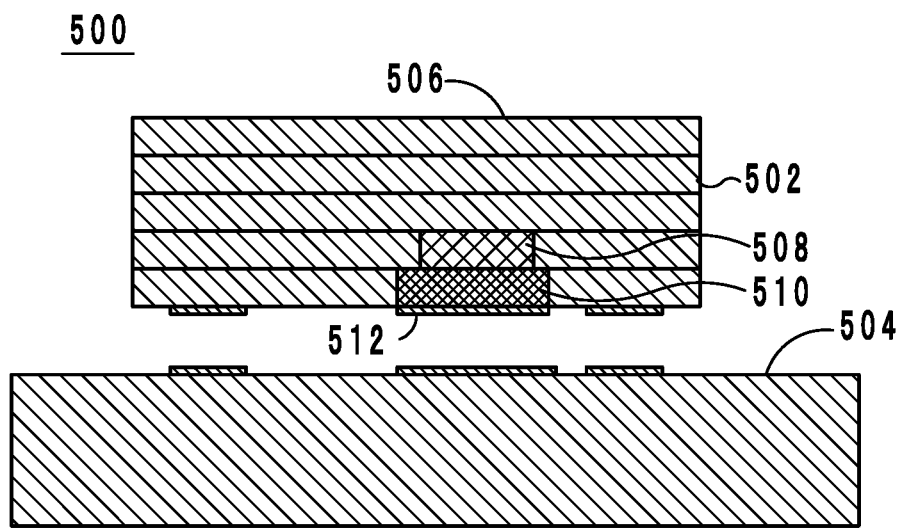
FIG. 7 is a sectional view showing the structure of the wireless communication module 500 disclosed in Japanese Patent Application Publication 2003-60523.

Next, an electronic device 10b and a multilayer substrate 20b according to a second modification of a preferred embodiment of the present invention will be described. FIG. 5 is a sectional view showing the structure of the electronic device 10b according to the second modification. FIG. 6 is an exploded view of the multilayer substrate 20b according to the second modification.

The multilayer substrate 20b differs from the multilayer substrate 20 in that the multilayer substrate 20b does not include the electronic component 60 mounted thereon but incorporates an electronic component 70 therein. The following description of the multilayer substrate 20b will focus on the difference. Descriptions of the same elements and portions of the multilayer substrate 20b as those of the multilayer substrate 20 will be omitted or simplified.

The multilayer substrate 20b includes a base 22, external electrodes 26a and 26b, circuit conductor layers 128a to 128c and 129a to 129c, via-hole conductors v11 to v15 and v21 to v25, a heat transfer member 50, joining members 52a and 52b, and an electronic component 70. Other external electrodes in addition to the external electrodes 26a and 26b are provided, but the external electrodes except for the external electrodes 26a and 26b are not shown in FIGS. 5 and 6. Similarly, other circuit conductor layers in addition to the circuit conductor layers 128a to 128c and 129a to 129c are provided, but the circuit conductor layers except for the circuit conductor layers 128a to 128c and 129a to 129c are not shown in FIGS. 5 and 6. Similarly, other via-hole conductors in addition to the via-hole conductors v11 to v15 and v21 to v25 are provided, but the via-hole conductors except for the via-hole conductors v11 to v15 and v21 to v25 are not shown in FIGS. 5 and 6.

The base 22 is a laminated body including insulating sheets 22a to 22e (an example of a plurality of insulating layers) stacked in this order from top to bottom. The insulating sheets 22c and 22d include through-holes H3 and H4 which are preferably rectangular or substantially rectangular when viewed from above, respectively, in their respective centers (around the respective intersections of diagonal lines). The through-holes H3 and H4 connect the front and back surfaces of the insulating sheets 22c and 22d respectively. The outlines of the through-holes H3 and H4 coincide with each other when viewed from above.

The insulating sheet 22e includes a through-hole H5 which is preferably rectangular or substantially rectangular when viewed from above in the center (around the intersection of diagonal lines). The through-hole H5 connects the front and back surfaces of the insulating sheet 22e. The through-hole H5 is preferably smaller than the through-holes H3 and H4 when viewed from above. The outline of the through-hole H5 is within the outlines of the through-holes H3 and H4.

The electronic component 70 is embedded in the base 22. The electronic component 70 is preferably, for example, a semiconductor integrated circuit. The electronic component 70 may be a chip electronic component, such as a capacitor, an inductor, or other suitable component, for example. The electronic component is preferably cuboidal, and is disposed inside the through-holes H3 and H4. The electronic component 70 includes external electrodes (not shown) on its upper surface.

The external electrode 30b (an example of a first metal film) is preferably a rectangular or substantially rectangular conductor layer and is disposed on the back surface of the insulating sheet 22e. When viewed from above, the external electrode 30b covers the entire or substantially the entire through-hole H5 from below and extends from the through-hole H5 outward. The surface roughness of the surface of the external electrode 30b in contact with the insulating sheet 22e is greater than the surface roughness of the surface of the external electrode 30b out of contact with the insulating sheet 22e.

The heat transfer member 50 is a cuboidal metal block extending in the up-down direction and is disposed inside the through-hole H5. Thus, the heat transfer member 50 extends through the insulating sheet 22e (an example of a first insulating layer which is one of the plurality of insulating layers and is located nearest to the first principal surface) in the up-down direction. The insulating sheet 22e adheres to the heat transfer member 50.

The upper surface of the heat transfer member 50 is positioned near the front surface of the insulating sheet 22e. The lower surface of the heat transfer member 50 is positioned near the back surface of the base 22. As described above, the external electrode 30b extends outward from the through-hole H5 when viewed from above or below. Therefore, the external electrode 30b covers the entire or substantially the entire lower surface of the heat transfer member 50 when viewed from below. The outline of the lower surface of the heat transfer member 50 is within the outline of the external electrode 30b when viewed from below.

The joining member 52a is disposed between the heat transfer member 50 and the electronic component 70. The joining member 52b (an example of a first joining member) is disposed between the heat transfer member 50 and the external electrode 30b. The joining member 52a is not essential to the multilayer substrate 20b, and may not be included.

The external electrodes 26a and 26b are preferably rectangular or substantially rectangular conductor layers and are disposed on the back surface of the insulating sheet 22e. The external electrode 26a is located at the left side of the through-hole H5 when viewed from below. The external electrode 26b is positioned at the right side of the through-hole H5 when viewed from below.

The circuit conductor layer 128a is disposed in the left half of the front surface of the insulating sheet 22b, and circuit conductor layer 128a is a linear trace extending in the right-left direction. The circuit conductor layer 128b is disposed in the left half of the front surface of the insulating sheet 22c, and the circuit conductor layer 128b is preferably a rectangular or substantially rectangular trace which overlaps the left side of the circuit conductor layer 128a when viewed from above. The circuit conductor layer 128c is disposed in the left half of the back surface of the insulating sheet 22d, and the circuit conductor layer 128d is preferably a rectangular or substantially rectangular trace which overlaps the circuit conductor layer 128a when viewed from above.

The via-hole conductor v11 extends through the insulating sheet 22b in the up-down direction to connect one of the external electrodes (not shown) disposed on the upper surface of the electronic component 70 and the right end of the circuit conductor layer 128a. The via-hole conductor v12 extends through the insulating sheet 22b in the up-down direction to connect the left end of the circuit conductor layer 128a and the circuit conductor layer 128b. The via-hole conductors v13 and v14 extend through the insulating sheets 22c and 22d, respectively, in the up-down direction and form a series of via-hole conductors. The via-hole conductors v13 and v14 connect the circuit conductor layer 128b and the circuit conductor layer 128c. The via-hole conductor v15 extends through the insulating sheet 22e in the up-down direction to connect the circuit conductor layer 128c and the external electrode 26a.

Thus, the circuit conductor layers 128a to 128c and the via-hole conductors v11 to v15 electrically connect the external electrode of the electronic component 70 and the external electrode 26a.

The circuit conductor layer 129a is disposed in the right half of the front surface of the insulating sheet 22b, and the circuit conductor layer 129a is a linear trace extending in the right-left direction. The circuit conductor layer 129b is disposed in the right half of the front surface of the insulating sheet 22c, and the circuit conductor layer 129b is preferably a rectangular or substantially rectangular trace which overlaps the right end of the circuit conductor layer 129a when viewed from above. The circuit conductor layer 129c is disposed in the right half of the back surface of the insulating sheet 22d, and the circuit conductor layer 129b is preferably a rectangular or substantially rectangular trace which overlaps the circuit conductor layer 129b when viewed from above.

The via-hole conductor v21 extends through the insulating sheet 22b in the up-down direction to connect another of the external electrodes (not shown) disposed on the upper surface of the electronic component 70 and the left end of the circuit conductor layer 129a. The via-hole conductor v22 extends through the insulating sheet 22b in the up-down direction to connect the right end of the circuit conductor layer 129a and the circuit conductor layer 129b. The via-hole conductors v23 and v24 extend through the insulating sheets 22c and 22d, respectively, in the up-down direction and form a series of via-hole conductors. The via-hole conductors v23 and v24 connect the circuit conductor layer 129b and the circuit conductor layer 129c. The via-hole conductor v25 extends through the insulating sheet 22e in the up-down direction to connect the circuit conductor layer 129c and the external electrode 26b.

Thus, the circuit conductor layers 129a to 129c and the via-hole conductors v21 to v25 electrically connect the external electrode of the electronic component 70 and the external electrode 26b.

The multilayer substrate 20b having the above-described structure is mounted on the front surface of the mother board 100. Specifically, the external electrodes 26a and 26b are connected to the external electrodes 104a and 104b via solder 110a and 110b, respectively. The eternal electrode 30a is connected to the external electrode 106 via solder 110c.

In the multilayer substrate 20b, the heat transfer member 50 is prevented from easily coming off or detaching from the base 22 for the same or substantially the same reasons as described in connection with the multilayer substrate 20.

The multilayer substrate 20b has a high capacity of dissipating heat from the multilayer substrate 20b and the electronic component 70. Specifically, the joining member 52b is disposed between the heat transfer member 50 and the external electrode 30b, and the joining member 52b is made of a material with the coefficient of thermal conductivity E3, which is higher than the coefficient of thermal conductivity E1 of the insulating sheets 22a to 22e. This prevents a gap from being provided between the heat transfer member 50 and the external electrode 30b. Thus, heat generated by the multilayer substrate 20b and heat generated by the electronic component 70 are transferred from the heat transfer member 50 to the external electrode 30b via the joining member 52b efficiently.

Multilayer substrates, electronic devices, and methods for manufacturing multilayer substrates are not limited to the multilayer substrates 20, 20a and 20b, the electronic devices 10, 10a and 10b, and the methods for manufacturing the multilayer substrates 20, 20a and 20b according to preferred embodiments of the present invention, and various changes and modifications are possible within the scope of the invention.

The structures of the multilayer substrates 20, 20a and 20b, and the structures of the electronic devices 10, 10a and 10b may be combined arbitrarily.

The joining members 52a and 52b are not limited to tin-plated films, and the joining members 52a and 52b may be made of a conductive paste primarily including tin and secondarily including nickel, copper, silver, or other suitable materials, for example. In this case, during thermocompression bonding, the conductive paste is solidified into the joining members 52a and 52b. Also, by using the same conductive paste as the material of the joining members 52a and 52b and as the material of the via-hole conductors v1 to v4, the bonding between the via-hole conductors v1 to v4 and the circuit conductor layers (or external electrode) and the bonding between the joining members 52a and 52b and the external electrodes 30a and 30b is able to be performed at one time during the thermocompression bonding. Further, solid-phase diffusion layers are formed at the respective boundaries between the via-hole conductors v1 to v4 and the circuit conductor layers at the same time as the solid-phase diffusion layers are formed at the respective boundaries between the joining members 52a and 52b and the external electrode 30a and 30b.

The material of the joining members 52a and 52 may be a material not forming a solid-phase diffusion layer. Such a material not forming a solid-phase diffusion layer is, for example, a conductive adhesive agent in which conductive spheres are dispersed in resin.

The joining members 52a and 52b may not be conductive. Such a non-conductive material usable as the material of the joining members 52a and 52b is, for example, a thermal grease.

The multilayer substrates 20 and 20b may be used without being mounted on the mother board 100.

The multilayer substrates 20 and 20a may not include the electronic component 60. In this case, heat generated in the multilayer substrate 20 or 20b is transferred to the mother board 100 via the heat transfer member 50, the joining member 52*b*, and the external electrode 30*b*, and is also transferred into the air via the heat transfer member 50, the joining member 52*a*, and the external electrode 30*a*.

In the multilayer substrate 20*b*, the heat transfer member 50 may be located in the upper side of the electronic component 70, and the external electrode 30*a* (an example of a first metal film) may be provided instead of the external electrode 30*b*.

As described herein, preferred embodiments of the present invention are useful in multilayer substrates, electronic devices, and methods for manufacturing multilayer substrates, and particularly, preferred embodiments of the present invention have the advantage of preventing a drop or detachment of a heat transfer member from a base.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a base including a plurality of insulating layers stacked on one another in a layer stacking direction, a first principal surface, and a second principal surface, the plurality of insulating layers being made of a material including thermoplastic resin;
    a heat transfer member disposed in a through-hole extending through at least a first insulating layer of the plurality of insulating layers nearest to the first principal surface, the heat transfer member being made of a material with a second coefficient of thermal conductivity higher than a first coefficient of thermal conductivity of the material of the plurality of insulating layers;
    a first metal film in contact with and adhered to the first principal surface, the first metal film overlapping the heat transfer member when viewed from the layer stacking direction;
    a first joining member disposed between the heat transfer member and the first metal film, the first joining member being made of a material with a third coefficient of thermal conductivity higher than the first coefficient of thermal conductivity of the material of the plurality of insulating layers;
    a second joining member; and
    a via-hole conductor; wherein
    a thickness, which is a dimension in the layer stacking direction, of the first joining member is smaller than a thickness of the first insulating layer;
    each of the first joining member and the second joining member is disposed in the through-hole; and
    the first metal film is in contact with and adhered to the first principal surface by being adhered to the first insulating layer.

2. The multilayer substrate according to claim 1, wherein the heat transfer member extends through the plurality of insulating layers in the layer stacking direction;
    the plurality of insulating layers include a second insulating layer which is located nearest to the second principal surface;
    the multilayer substrate further includes a second metal film adhered to the second principal surface, the second metal film overlapping the heat transfer member when viewed from the layer stacking direction; and
    the second joining member is disposed between the heat transfer member and the second metal film, the second joining member being made of a material with a fourth coefficient of thermal conductivity higher than the first coefficient of thermal conductivity of the material of the plurality of insulating layers.

3. The multilayer substrate according to claim 2, further comprising:
    an electronic component mounted on the second principal surface; wherein
    the electronic component is connected to the second metal film.

4. The multilayer substrate according to claim 3, wherein the electronic component is electrically connected to the second metal film.

5. The multilayer substrate according to claim 1, wherein the heat transfer member includes a metal block.

6. The multilayer substrate according to claim 1, wherein the heat transfer member is made of the same material as the first metal film.

7. The multilayer substrate according to claim 1, wherein
    the heat transfer member is made of copper; and
    the first joining member is made of a conductive material including tin.

8. The multilayer substrate according to claim 1, wherein the first insulating layer is adhered to the heat transfer member.

9. The multilayer substrate according to claim 1, wherein a surface roughness of a surface of the first metal film in contact with the first insulating layer and the first joining member is greater than a surface roughness of a surface of the first metal film not in contact with the first insulating layer and the first joining member.

10. An electronic device comprising:
    a mother board; and
    a multilayer substrate according to claim 1.

11. The electronic device according to claim 10, wherein
    the heat transfer member extends through the plurality of insulating layers in the layer stacking direction;
    the plurality of insulating layers include a second insulating layer nearest to the second principal surface;
    the multilayer substrate further includes a second metal film adhered to the second principal surface, the second metal film overlapping the heat transfer member when viewed from the layer stacking direction; and
    the second joining member is disposed between the heat transfer member and the second metal film, the second joining member being made of a material with a fourth coefficient of thermal conductivity higher than the first coefficient of thermal conductivity of the material of the plurality of insulating layers.

12. The electronic device according to claim 10, further comprising:
    an electronic component mounted on the second principal surface; wherein
    the electronic component is connected to the second metal film.

13. The electronic device according to claim 12, wherein the electronic component is electrically connected to the second metal film.

14. The electronic device according to claim 10, wherein the heat transfer member includes a metal block.

15. The electronic device according to claim 10, wherein the heat transfer member is made of the same material as the first metal film.

16. The electronic device according to claim 10, wherein
    the heat transfer member is made of copper; and
    the first joining member is made of a conductive material including tin.

17. The electronic device according to claim 10, wherein the first insulating layer is adhered to the heat transfer member.

18. The electronic device according to claim 10, wherein a surface roughness of a surface of the first metal film in contact with the first insulating layer and the first joining member is greater than a surface roughness of a surface of the first metal film not in contact with the first insulating layer and the first joining member.

19. A multilayer substrate comprising: a base including a plurality of insulating layers stacked on one another in a layer stacking direction, a first principal surface, and a second principal surface, the plurality of insulating layers being made of a material including thermoplastic resin;
a heat transfer member disposed in a through-hole extending through at least a first insulating layer of the plurality of insulating layers nearest to the first principal surface, the heat transfer member being made of a material with a second coefficient of thermal conductivity higher than a first coefficient of thermal conductivity of the material of the plurality of insulating layers;
a first metal film in contact with and adhered to the first principal surface, the first metal film overlapping the heat transfer member when viewed from the layer stacking direction;
a first joining member disposed between the heat transfer member and the first metal film, the first joining member being made of a material with a third coefficient of thermal conductivity higher than the first coefficient of thermal conductivity of the material of the plurality of insulating layers;
a second joining member;
a via-hole conductor; and
a chip electronic component disposed in the base including the plurality of insulating layers; wherein
a thickness, which is a dimension in the layer stacking direction, of the first joining member is smaller than a thickness of the first insulating layer;
each of the first joining member and the second joining member is disposed in the through-hole; and
the first metal film is in contact with and adhered to the first principal surface by being adhered to the first insulating layer.

20. The multilayer substrate according to claim 19, wherein
the material of the first joining member is the same as the material of the via-hole conductor.

* * * * *